(12) United States Patent
Shen et al.

(10) Patent No.: US 12,017,908 B2
(45) Date of Patent: Jun. 25, 2024

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Ching-Kai Shen, Hsinchu County (TW); Jung-Kuo Tu, Hsinchu (TW); Wei-Cheng Shen, Tainan (TW); Yi-Chuan Teng, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 335 days.

(21) Appl. No.: 17/239,006

(22) Filed: Apr. 23, 2021

(65) Prior Publication Data

US 2022/0340408 A1 Oct. 27, 2022

(51) Int. Cl.
*B81B 3/00* (2006.01)
*B81C 1/00* (2006.01)

(52) U.S. Cl.
CPC ........ *B81B 3/0021* (2013.01); *B81C 1/00047* (2013.01); *B81B 2203/0127* (2013.01); *B81B 2203/0315* (2013.01); *B81B 2203/0376* (2013.01); *B81B 2203/0384* (2013.01); *B81B 2203/0392* (2013.01); *B81B 2203/04* (2013.01); *B81B 2207/07* (2013.01)

(58) Field of Classification Search
CPC ............ B81C 1/00047; B81C 1/00103; B81B 2203/0315; B81B 2203/0376; B81B 2203/0384; B81B 2203/0392; B81B 2201/0271; B81B 2203/0127; B81B 2203/04; B81B 2207/07
See application file for complete search history.

(56) References Cited

U.S. PATENT DOCUMENTS

2013/0127036 A1* 5/2013 Kuo .................. B81B 3/001
                                                           257/E23.181
2018/0334378 A1* 11/2018 Tsai .................. B81B 3/001

* cited by examiner

*Primary Examiner* — Moazzam Hossain
(74) *Attorney, Agent, or Firm* — WPAT LAW; Anthony King

(57) ABSTRACT

A semiconductor structure includes a substrate, a MEMS substrate, a dielectric structure between the substrate and the MEMS substrate, a cavity in the dielectric structure, an electrode over the substrate, and a protrusion disposed in the cavity. The MEMS substrate includes a movable membrane, and the cavity is sealed by the movable membrane. A height of the protrusion is less than a depth of the cavity.

20 Claims, 15 Drawing Sheets

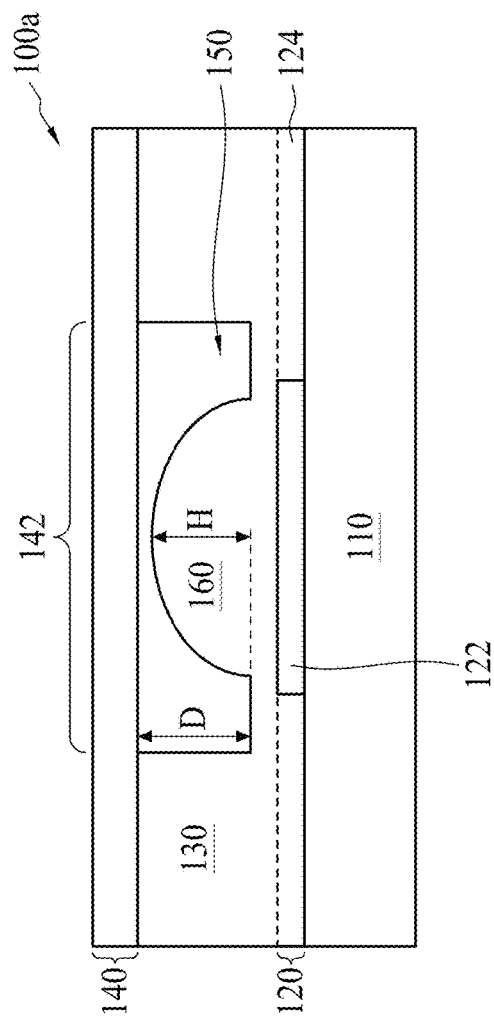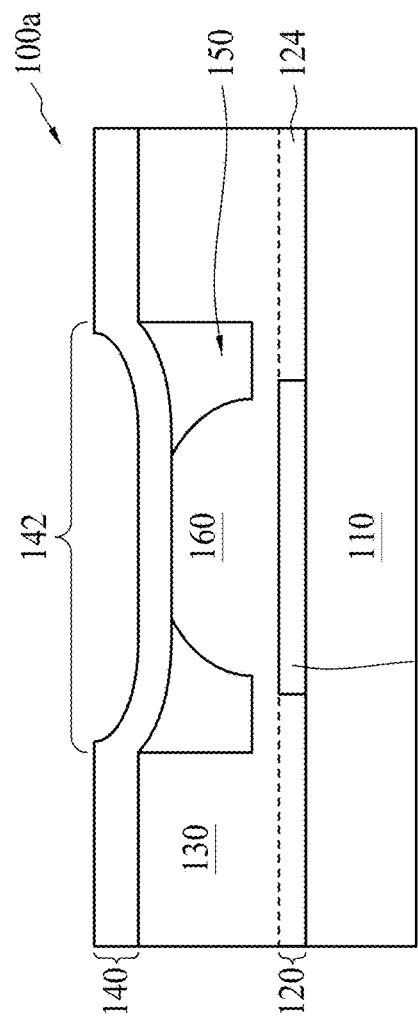

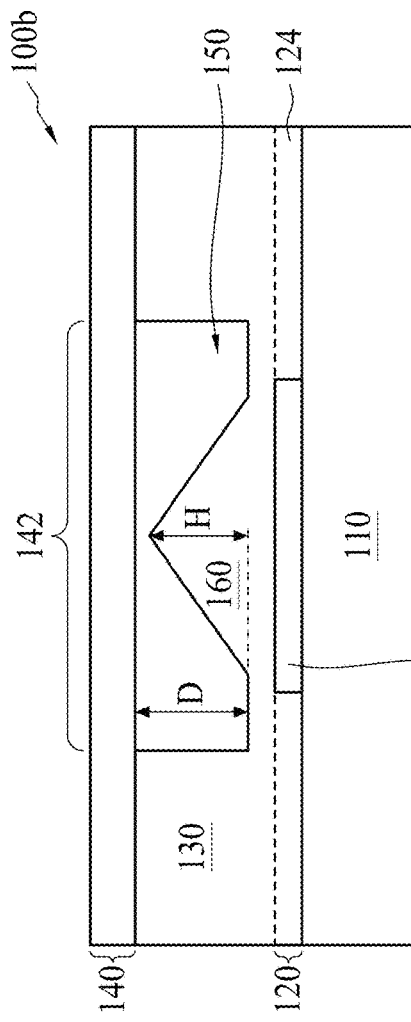
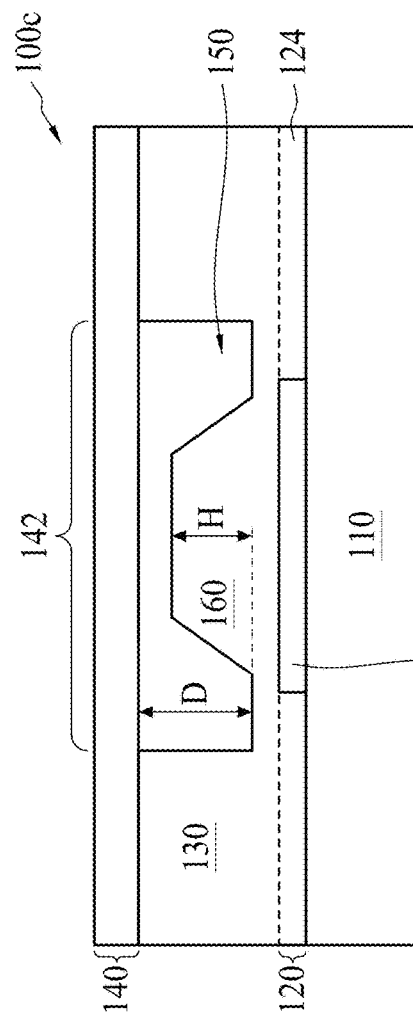
FIG. 2
FIG. 3

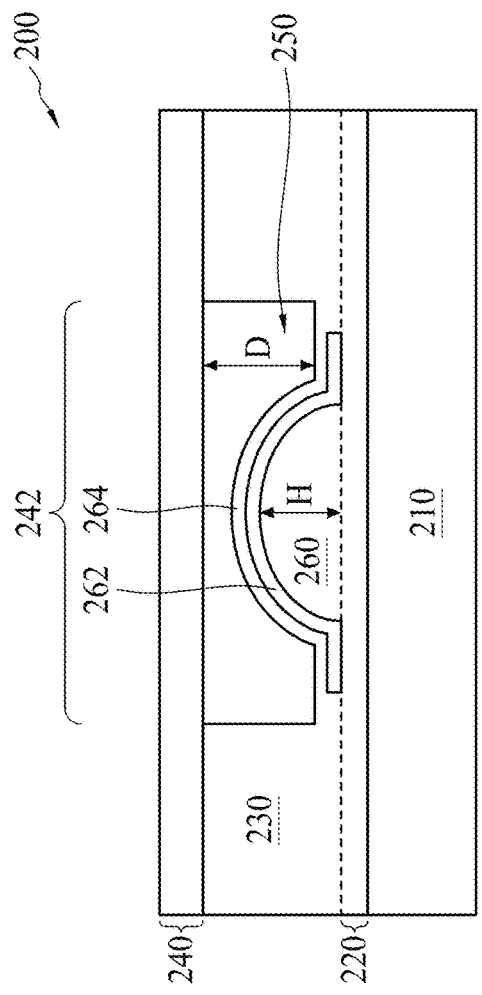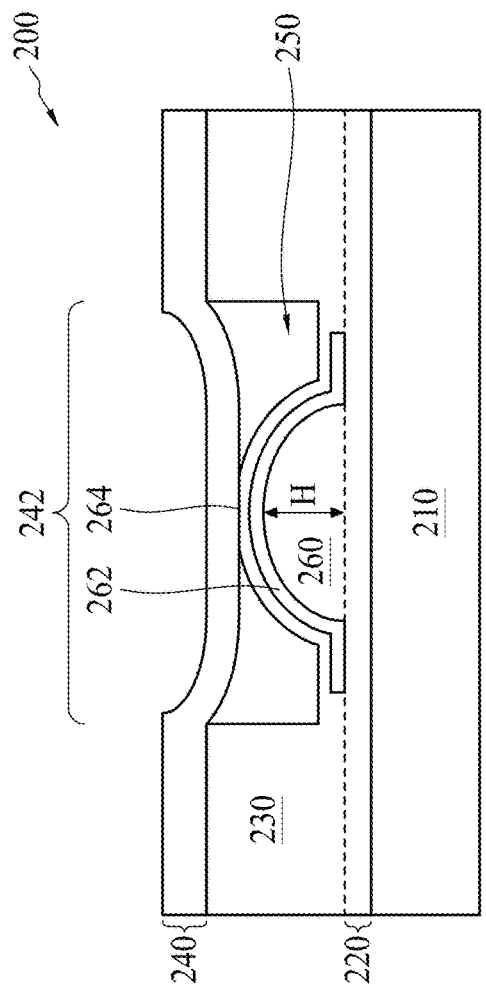

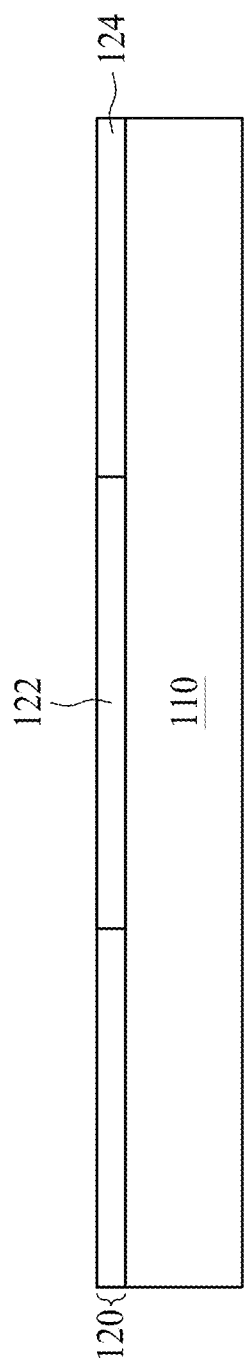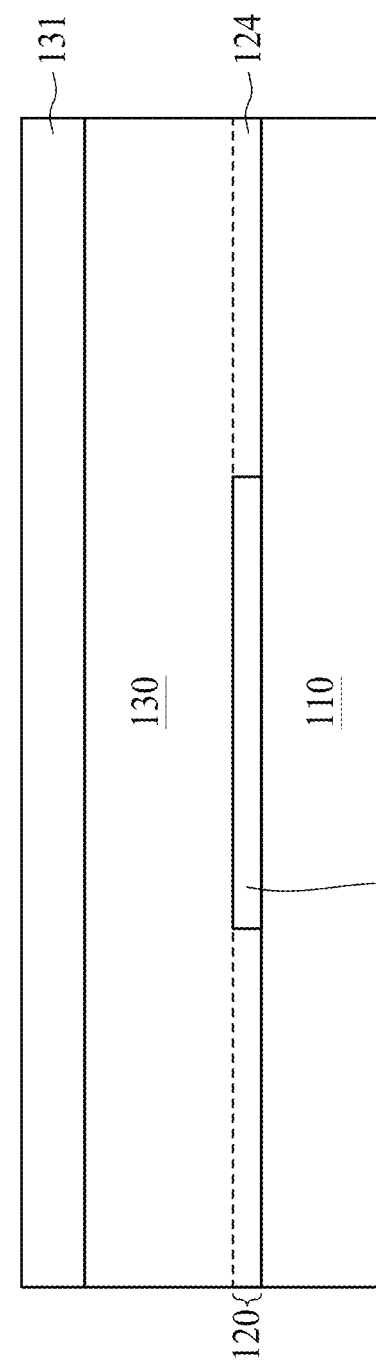

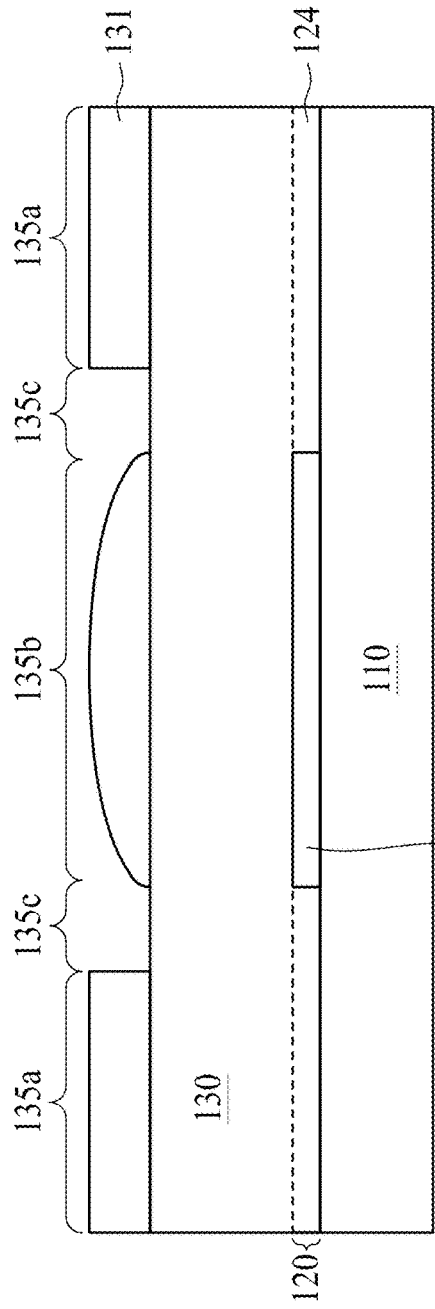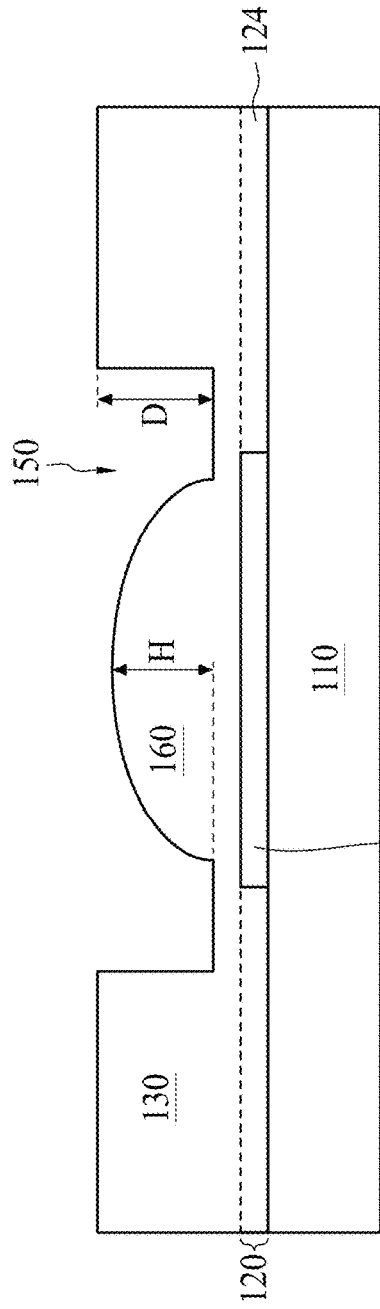

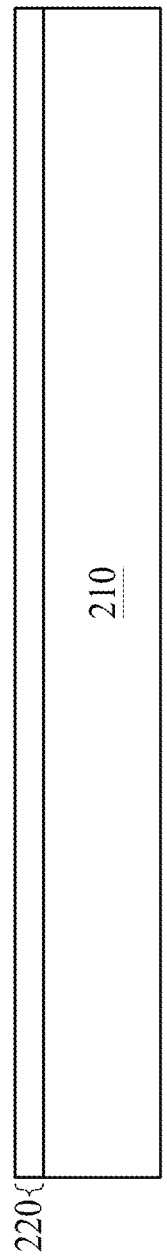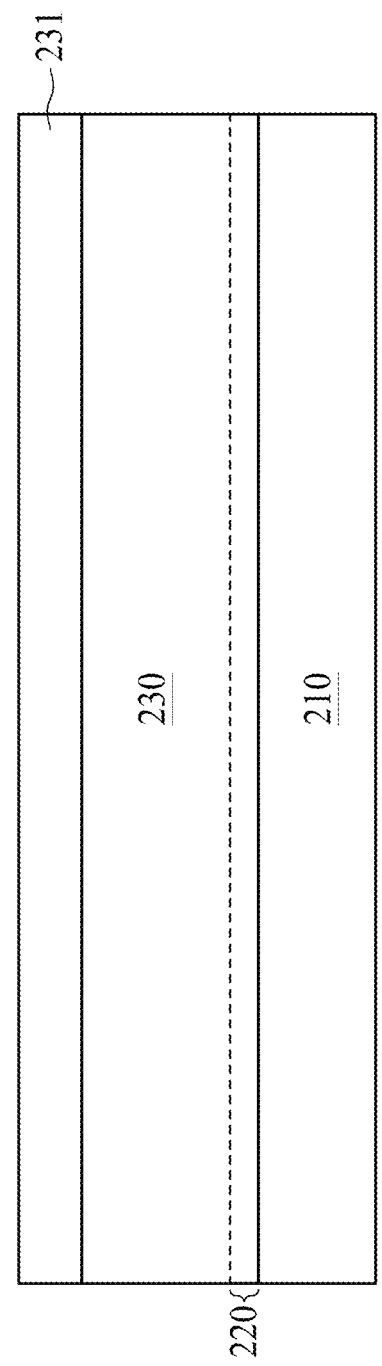

SEMICONDUCTOR STRUCTURE AND METHOD FOR FORMING THE SAME

BACKGROUND

Microelectromechanical systems (MEMS) devices, such as accelerometers, pressure sensors, microphones, and transducers have found widespread use in many modern-day electronic devices. For example, MEMS accelerometers and transducers are commonly found in automobiles (e.g., airbag deployment systems), tablet computers, and medical devices. Usually, MEMS device has a movable part, which detects a motion and converts the motion into an electrical signal, or converts an electrical signal into motion by causing the movable part to move. For example, a transducer includes a movable membrane that converts sound waves to an electrical signal, when operating as a receiver. Alternatively, the movable membrane may move or vibrate according to electrical signals, when operating as a transmitter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a schematic drawing illustrating a semiconductor structure according to aspects of the present disclosure.

FIG. 1B is a schematic drawing illustrating the semiconductor structure of FIG. 1A in operation according to aspects of the present disclosure.

FIG. 2 is a schematic drawing illustrating a semiconductor structure according to aspects of the present disclosure.

FIG. 3 is a schematic drawing illustrating a semiconductor structure according to aspects of the present disclosure.

FIG. 6A is a schematic drawing illustrating a semiconductor structure according to aspects of the present disclosure.

FIG. 6B is a schematic drawing illustrating the semiconductor structure of FIG. 6A in operation according to aspects of the present disclosure.

FIGS. 8A to 8G are schematic drawings illustrating a semiconductor structure at various fabrication stages constructed according to aspects of the present disclosure in one or more embodiments.

FIGS. 10A to 10I are schematic drawings illustrating a semiconductor structure at various fabrication stages constructed according to aspects of the present disclosure in one or more embodiments.

DETAILED DESCRIPTION

Figure 4:
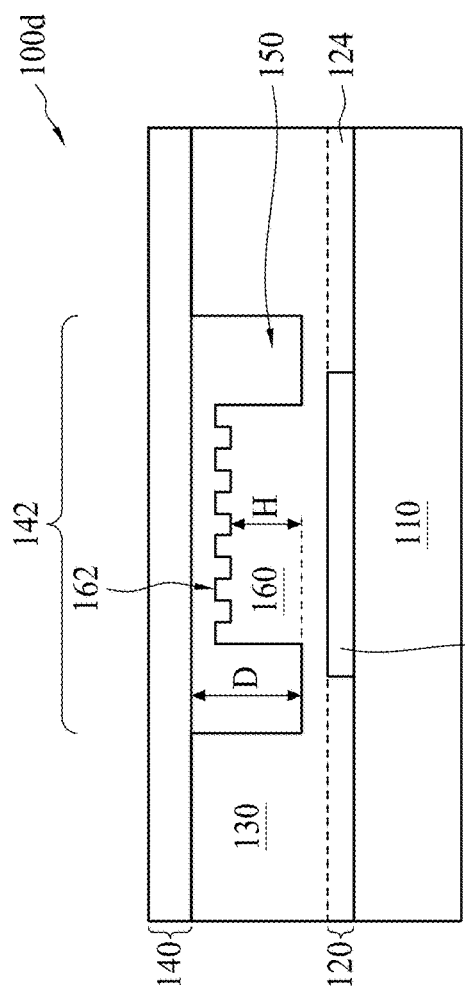
FIG. 4 is a schematic drawing illustrating a semiconductor structure according to aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, and these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In some embodiments, the MEMS device is a capacitive micro-machined ultrasonic transducer (CMUT). The CMUT may operate as a transmitter by converting electrical signals into acoustic energy (e.g., ultrasonic waves), and/or the CMUT may operate as a receiver (e.g., a sensor) by converting acoustic energy into electrical signals. When operating as a transmitter, the CMUT may transmit acoustic energy by applying an electrical signal (e.g., an alternating current (AC) signal) across the MEMS device to cause the movable membrane to generate the acoustic energy. In some embodiments, each CMUT cell has a top electrode disposed in the movable membrane and a bottom electrode disposed in a dielectric layer over a substrate. The movable membrane is spaced apart from the substrate, thus a sealed cavity is defined between the movable membrane and the dielectric layer. During operation, AC signals are applied to the CMUT cell. The alternating electrostatic force between the top and bottom electrodes actuate the movable membrane. In some embodiments, the movable membrane is pulled-in to contact a bottom surface of the sealed cavity and then vibrated at a resonant frequency to transmit and receive an acoustic signal while operating.

As mentioned above, the movable membrane has to be pulled in to contact the bottom surface of the sealed cavity with a pull-in voltage. In some comparative embodiments, the pull-in voltage is greater than 40V. It is found that charges are easily accumulated in the dielectric layer during operating with such pull-in voltage, and the accumulated charges adversely impact device performance. Therefore, reduction of charge accumulation is one of the key points for improving a CMUT cell. For broadband applications, resonant frequency must be tuned by increasing pull-in voltage. In other words, tunable resonant frequency is another key point for improving a CMUT cell. However, it is found that the greater pull-in voltage induces accumulation of more charges. The contact between the movable membrane and the bottom surface of the sealed cavity may further induce charge accumulation due to friction, which adversely impacts device performance of the CMUT cell.

The present disclosure provides a semiconductor structure including a protrusion disposed in the sealed cavity. A moving distance between the movable membrane and the protrusion is therefore less than a distance between the movable membrane and the bottom surface of the sealed cavity. Accordingly, the pull-in voltage is reduced, which effectively reduces the accumulation of charges.

Referring to FIGS. 1A, 1B and 2 to 5, which are schematic drawings respectively illustrating a semiconductor structure according to aspects of the present disclosure, semiconductor structures 100a, 100b, 100c, 100d, and 100e are provided. It should be noted that same elements in FIGS. 1A, 1B and 2 to 5 are indicated by same numerals, and may include same materials. As shown in FIGS. 1A and 2 to 5, the semiconductor structure 100a, 100b, 100c, 100d and 100e respectively include a substrate 110, an interconnect structure 120 over the substrate 110, a dielectric structure 130 over the interconnect structure 120, and a MEMS substrate 140.

In some embodiments, the substrate 110 may include a semiconductor substrate (not shown) with one or more IC devices (not shown) disposed in and over the semiconductor substrate. The semiconductor substrate may include any type of semiconductor material, such as monocrystalline silicon, silicon-germanium (SiGe), silicon on insulator (SOI), or the like. The IC devices may be, or include, active electronic devices (i.e., transistors), passive electronic devices (i.e., resistors, capacitors, inductor, fuses), other electronics devices, or combinations thereof.

In some embodiments, the interconnect structure 120 includes a plurality of dielectric layers, a plurality of conductive layers disposed in the dielectric layers, and a plurality of conductive vias electrically connecting the conductive layers. Further, the conductive layers of the interconnect structure 120 may electrically connect the IC devices in the substrate 110 to other devices or circuits. For example, a top conductive layer 122 disposed in a dielectric layer 124 is electrically connected to other IC devices, though not shown. In some embodiments, the dielectric layers (including the dielectric layer 124) may include silicon oxide, silicon nitride, silicon oxynitride, a low-k material (such as a dielectric material with a dielectric constant less than approximately 3.9), or a combination thereof. In some embodiments, the conductive layers, the conductive vias, and the top conductive layer 122 may include metals (such as copper (Cu), aluminum (Al), tungsten (W), AlCu, or the like), metal nitrides (such as titanium nitride (TiN)), other conductive materials, or a combination thereof. It should be noted that although only the top conductive layer 122 and the dielectric layer 124 are shown, those skilled in the art would easily realize the conductive layers, the conductive vias and the dielectric layers underlying the top conductive layer 122 and the dielectric layer 124 because the interconnect structure 120 is made by back-end-of-line (BEOL) processes. In some embodiments, the top conductive layer 122 serves as a bottom electrode of a CMUT cell.

The dielectric structure 130 is disposed between the interconnect structure 120 and the MEMS substrate 140. In some embodiments, the dielectric structure 130 may be a single-layered structure. In some alternative embodiments, the dielectric structure 130 may be a multi-layered structure. In some embodiments, a material of the dielectric structure 130 may be similar to that of the dielectric layer 124 of the interconnect structure 120, but the disclosure is not limited thereto.

In some embodiments, the MEMS substrate 140 may include a semiconductor material such as polysilicon, amorphous silicon, monocrystalline silicon, germanium, SiGe, or the like. In such embodiments, the MEMS substrate 140 may be doped. The MEMS substrate 140 includes a movable membrane 142. In some embodiments, the movable membrane 142 may be a doped region of the MEMS substrate 140. In such embodiments, the MEMS substrate 140 may include a first conductivity type (i.e., p-type), and the movable membrane 142 may include a second conductive type (i.e., n-type). In some embodiments, the movable membrane 142 may include a conductive layer disposed along a lower surface or an upper surface of the MEMS substrate 140, though not shown. In some embodiments, the doped region or the conductive layer over the MEMS substrate 140 serves as a top electrode of the CMUT cell.

The semiconductor structure 100a, 100b, 100c, 100d, 100e further includes a cavity 150 disposed in the dielectric structure 130. Further, the cavity 150 is sealed by the movable membrane 142 of the MEMS substrate 140. In some embodiments, a depth D of the cavity 150 is less than a thickness of the dielectric structure 130. In some embodiments, the depth D of the cavity 150 is between approximately 2,000 Å and approximately 2,500 Å, but the disclosure is not limited thereto. Therefore, the dielectric structure 130 may form sidewalls and a bottom of the cavity 150, while the movable membrane 142 serves as a top cap of the cavity 150. In some embodiments, the cavity 150 overlaps the top conductive layer 122. However, the top conductive layer 122 is entirely covered by the dielectric structure 130.

The semiconductor structure 100a, 100b, 100c, 100d, 100e further includes a protrusion 160 disposed in the cavity 150. As shown in FIGS. 1A and 2 to 5, the protrusion 160 is separated from the sidewalls of the cavity 150. Further, the protrusion 160 overlaps the top conductive layer 122. In some embodiments, a bottom area of the protrusion 160 is less than an area of the top conductive layer 122. In some alternative embodiments, the bottom area of the protrusion 160 is greater than the area of the top conductive layer 122. In some embodiments, the protrusion 160 is separated from the movable membrane 142 when the semiconductor structure 100a, 100b, 100c, 100d, 100e is not in operation. A height H of the protrusion 160 may be defined as a distance between a top surface of the protrusion 160 and a bottom of the protrusion 160 (or a bottom surface of the cavity 150). Further, the height H of the protrusion 160 is less than the depth D of the cavity 150. In some embodiments, a ratio of the height H of the protrusion 160 to the depth D of the cavity 150 is between approximately 0.25 and approximately 0.75. In some embodiments, the height H of the protrusion 160 is between approximately 1,000 Å and approximately 1,500 Å, but the disclosure is not limited thereto. Additionally, a distance between the top conductive layer 122 and the top surface of the protrusion 160 is greater than the height H of the protrusion 160.

Figure 5:
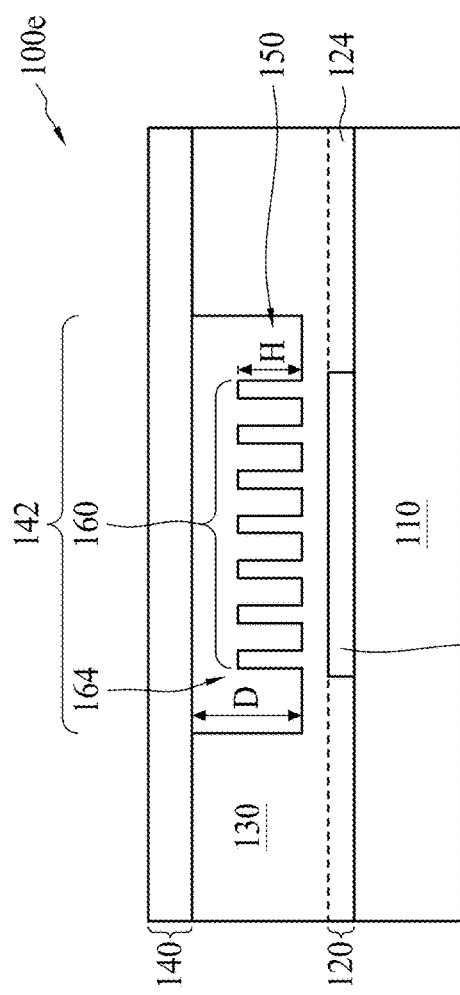
FIG. 5 is a schematic drawing illustrating a semiconductor structure according to aspects of the present disclosure.

Referring to FIG. 1A, in some embodiments, the protrusion 160 may form a semicircle in a cross-sectional view. Referring to FIG. 2, in some embodiments, the protrusion 160 may form a triangle in a cross-sectional view. Referring to FIG. 3, in some embodiments, the protrusion 160 may form a trapezoid in a cross-sectional view. Referring to FIG. 4, in some embodiments, the protrusion 160 may form a rectangle in a cross-sectional view. Further, in some embodiments, a plurality of teeth 162 are disposed over the top surface of the protrusion 160. In such embodiments, the teeth 162 are separated from the movable membrane 142 when the semiconductor structure 100d is not in operation. Referring to FIG. 5, in some embodiments, the protrusion 160 includes a plurality of pillars 164. In such embodiments, diameters of the pillars 164 may be same or different. Spacing distances between adjacent pillars 164 may be same or different. In such embodiments, a height of the pillars 164 may be the same. Further, a top surface of each pillar 164 is separated from the movable membrane 142 when the semiconductor structure 100e is not in operation.

Referring to FIG. 18, which is a schematic drawing illustrating the semiconductor structure of FIG. 1A in operation, during operation, a pull-in voltage is applied, and the movable membrane 142 moves toward the bottom of the cavity 150. However, a moving distance of the movable membrane 142 is limited due to the protrusion 160. In some embodiments, the pull-in voltage required to move the movable membrane 142 may be less than that in comparative approaches because the moving distance of the movable membrane 142 is limited. In some embodiments, the pull-in voltage may be reduced by approximately 25% or more compared to that in the comparative approaches. Further, accumulation of charges may be reduced because of the reduced pull-in voltage. It should be noted that although the movement of the movable membrane 142 is shown only in FIG. 1B, the protrusion 160 of the semiconductor structure 100b, 100c, 100d and 100e provides a same effect.

Referring back to FIGS. 1A, 2 and 3, in some embodiments, a width of an upper portion of the protrusion 160 is less than a width of a lower portion of the protrusion 160. In some embodiments, a cross-sectional area of the top surface of the protrusion is less than a cross-sectional area of the bottom surface of the protrusion 160. In such embodiments, an area of contact between the movable membrane 142 and the protrusion 160 may be reduced by a profile of the protrusion 160. Referring to FIG. 4, in some embodiments, the protrusion 160 forms a rectangle in a cross-sectional view. In such embodiments, the teeth 162 may be disposed over the top surface of the protrusion 160 in order to reduce the area of contact. Referring to FIG. 5, the pillars 164 of the protrusion help reduce the area of contact. Consequently, accumulation of charges due to friction may be further reduced, and thus device performance of the CMUT cell is improved.

Accordingly, the semiconductor structures 100a to 100e include the protrusions 160 with different profiles or configurations to reduce the moving distance of the movable membrane 142 and reduce the area of contact between the protrusion 160 and the movable membrane 142. Consequently, the pull-in voltage and the accumulation of charges are both reduced.

Please refer to FIGS. 6A and 6B, wherein FIG. 6A is a schematic drawings illustrating a semiconductor structure according to aspects of the present disclosure, and FIG. 6B is a schematic drawing illustrating the semiconductor structure of FIG. 6A in operation according to aspects of the present disclosure. It should be noted that same elements in FIGS. 1A, 1B, 6A and 6B may include same materials; therefore, repeated descriptions are omitted for brevity.

As shown in FIGS. 6A and 6B, a semiconductor structure 200 is provided. The semiconductor structure 200 includes a substrate 210, an interconnect structure 220 over the substrate 210, a dielectric structure 230 over the interconnect structure 220, and a MEMS substrate 240. As mentioned above, the substrate 210 may include a semiconductor substrate (not shown) with one or more IC devices (not shown) disposed in and over the semiconductor substrate.

In some embodiments, the interconnect structure 220 includes a plurality of dielectric layers, a plurality of conductive layers disposed in the dielectric layers, and a plurality of conductive vias electrically connecting the conductive layers. Further, the conductive layers of the interconnect structure 220 may electrically connect the IC devices in the substrate 210 to the other devices or circuits. It should be noted that, although the conductive layers, the conductive vias, and the dielectric layers are omitted from FIGS. 6A and 6B, configurations and arrangements of such elements, which are made by BEOL processes, should be easily realized.

The dielectric structure 230 is disposed between the interconnect structure 220 and the MEMS substrate 240. As mentioned above, the dielectric structure 230 may be a single-layered structure or, alternatively, a multi-layered structure.

In some embodiments, the MEMS substrate 240 includes a movable membrane 242. In some embodiments, the movable membrane 242 may be a doped region of the MEMS substrate 240. In such embodiments, the MEMS substrate 240 and the movable membrane 242 may include dopants of complementary types. In some embodiments, the movable membrane 242 may include a conductive layer disposed along a lower surface or an upper surface of the MEMS substrate 240, though not shown. In some embodiments, the doped region or the conductive layer over the MEMS substrate 240 serves as a top electrode of a CMUT cell.

The semiconductor structure 200 further includes a cavity 250 disposed in the dielectric structure 230. Further, the cavity 250 is sealed by the movable membrane 242 of the MEMS substrate 240. In some embodiments, a depth D of the cavity 250 is less than a thickness of the dielectric structure 230. Therefore, the dielectric structure 230 may form sidewalls and a bottom of the cavity 250, while the movable membrane 242 serves as a top cap of the cavity 250.

The semiconductor structure 200 further includes a protrusion 260 disposed in the cavity 250. As shown in FIG. 6A, the protrusion 260 is separated from the sidewalls of the cavity 250. In some embodiments, the protrusion 260 is separated from the movable membrane 242 when the semiconductor structure 200 is not in operation. A height H of the protrusion 260 may be defined as a distance between a top surface of the protrusion 260 and a bottom of the protrusion 260 (or a bottom surface of the cavity 250). Further, the height H of the protrusion 260 is less than the depth D of the cavity 250. It should be noted that although the protrusion 260 shown in FIG. 6A forms a semicircle in a cross-sectional view, a profile of the protrusion 260 may be a triangle, a trapezoid, or a rectangle. In some embodiments, a plurality of teeth may be disposed over the top surface of protrusion 260, as with the protrusion 160 shown in FIG. 4. In some embodiments, the protrusion 260 may include a plurality of pillars, as with the protrusion 160 shown in FIG. 5.

The semiconductor structure 200 further includes a conductive layer 262 disposed over the top surface of the protrusion 260. In some embodiments, the conductive layer 262 is further disposed over a portion of the bottom surface of the cavity 250. The conductive layer 262 is electrically connected to the interconnect structure 220 and the IC devices in the substrate 210, though not shown. Therefore, the conductive layer 262 may serve as a bottom electrode of the CMUT cell. Further, the semiconductor structure 200 includes a dielectric layer 264 disposed over the conductive layer 262. The conductive layer 262 is separated from the sidewalls of the cavity 250. However, the dielectric layer 264 may be coupled to the bottom and the sidewalls of the cavity 250. The conductive layer 262 and the dielectric layer 264 are separated from the movable membrane 242 when the semiconductor structure 200 is not in operation, as shown in FIG. 6A. In some embodiments, a thickness of the conductive layer 262 is between approximately 1500 Å and approximately 2500 Å, but the disclosure is not limited thereto. In some embodiments, the dielectric layer 264 may include a material same as that of the dielectric structure 230, but the disclosure is not limited thereto.

Referring to FIG. 6B, during operation, a pull-in voltage is applied, and the movable membrane 242 moves toward the bottom of the cavity 250. However, a moving distance of the movable membrane 242 is limited due to the protrusion 260. In some embodiments, the pull-in voltage required to move the movable membrane 242 may be less than that in comparative approaches because the moving distance of the movable membrane 242 is less than that in the comparative approaches. In some embodiments, the pull-in voltage may be reduced by 25% or more compared to that of the comparative approaches. Further, accumulation of charges may be reduced because of the reduced pull-in voltage. In some embodiments, a capacitance may be increased compared to that of the comparative approaches because a distance between a top electrode (i.e., an electrode located in or over the movable membrane 242) and the bottom electrode (i.e., the conductive layer 262) is reduced. Further, in some embodiments, an area of the top surface of the protrusion 260 is less than an area of a bottom of the protrusion 260. In such embodiments, an area of contact between the movable membrane 242 and the protrusion 260 may be reduced by such configuration. Consequently, accumulation of charges due to friction may be further reduced.

Accordingly, the semiconductor structure 200 includes the protrusions 260 with different profiles or configurations to reduce the moving distance of the movable membrane 242 and reduce the area of contact between the protrusion 260 and the movable membrane 242. Consequently, the pull-in voltage and accumulation of charges are both reduced. Further, because the capacitance of the semiconductor structure 200 is increased, device performance of the semiconductor structure 200 is improved.

Figure 7:
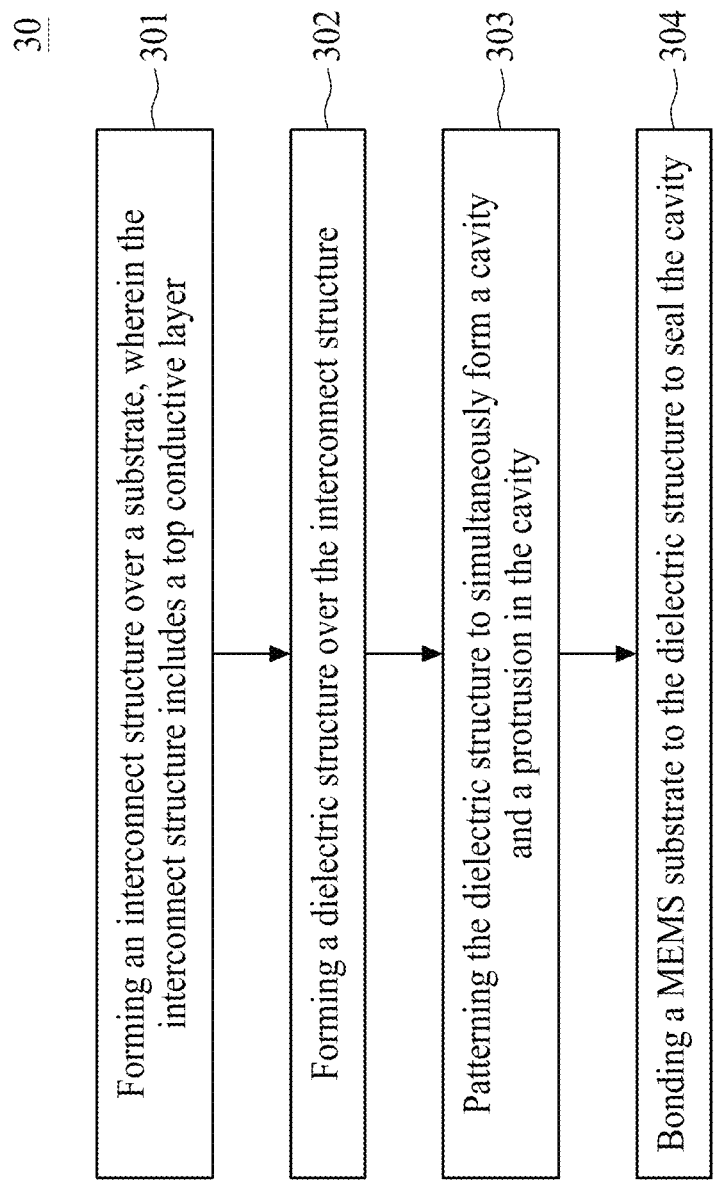
FIG. 7 is a flowchart representing a method for manufacturing a semiconductor structure according to aspects of the present disclosure.

FIG. 7 is a flowchart representing a method for manufacturing a semiconductor structure 30 according to aspects of the present disclosure. The method for forming the semiconductor structure 30 includes a number of operations (301, 302, 303 and 304) and is further described below according to one or more embodiments. It should be noted that the operations of the method 30 may be omitted, rearranged or otherwise modified within the scope of the various aspects. It should further be noted that additional operations may be provided before, during, and after the method 30, and that some other operations may be only briefly described herein. Thus, other implementations are possible within the scope of the various aspects described herein. FIGS. 8A to 8G are schematic drawings illustrating a semiconductor structure at various stages in a method for forming a semiconductor structure according to aspects of one or more embodiments of the present disclosure. It should be noted that same elements in FIGS. 1A and 8A to 8G include same materials; thus, repeated detailed descriptions of such elements are omitted for brevity.

Referring to FIG. 8A, in some embodiments, an interconnect structure 120 is formed over a substrate 110 in operation 301. As mentioned above, the substrate 110 may include a semiconductor substrate with various IC devices disposed in and over the semiconductor substrate. The IC devices may be formed in or over the semiconductor substrate by front-end-of-line (FEOL) processes. The interconnect structure 120 is formed over the substrate 110 by BEOL processes. Further, the interconnect structure 120 may be electrically connected to the IC devices by connecting structures made by middle-end-of-line (MEOL) processes. Detailed descriptions of the IC devices, the connecting structures, and the conductive layers, conductive vias and dielectric layers of the interconnect structure 120 are omitted. However, arrangements and connections of such elements may be easily realized because the FEOL processes, the MEOL processes and the BEOL processes may be familiar to those skilled in the art.

Still referring to FIG. 8A, the interconnect structure 120 includes a top conductive layer 122 disposed in a dielectric layer 124. As mentioned above, the top conductive layer 122 may be electrically connected to the IC devices through the conductive layers and conductive vias of the interconnect structure 120. Further, the top conductive layer 122 serves as a bottom electrode of a CMUT cell.

Referring to FIG. 8B, in some embodiments, a dielectric structure 130 is formed over the interconnect structure 120 in operation 302. As mentioned above, the dielectric structure 130 may be a single-layered or multi-layered structure. In some embodiments, the dielectric structure 130 may be formed by deposition such as a chemical vapor deposition (CVD), but the disclosure is not limited thereto. In some embodiments, after the forming of the dielectric structure 130, a masking layer 131 is formed on the dielectric structure 130. In some embodiments, the masking layer 131 may be a photoresist. In some embodiments, the masking layer 131 may be a multi-layered structure including a photoresist and a hard mask layer, but the disclosure is not limited thereto.

Figure 8C:
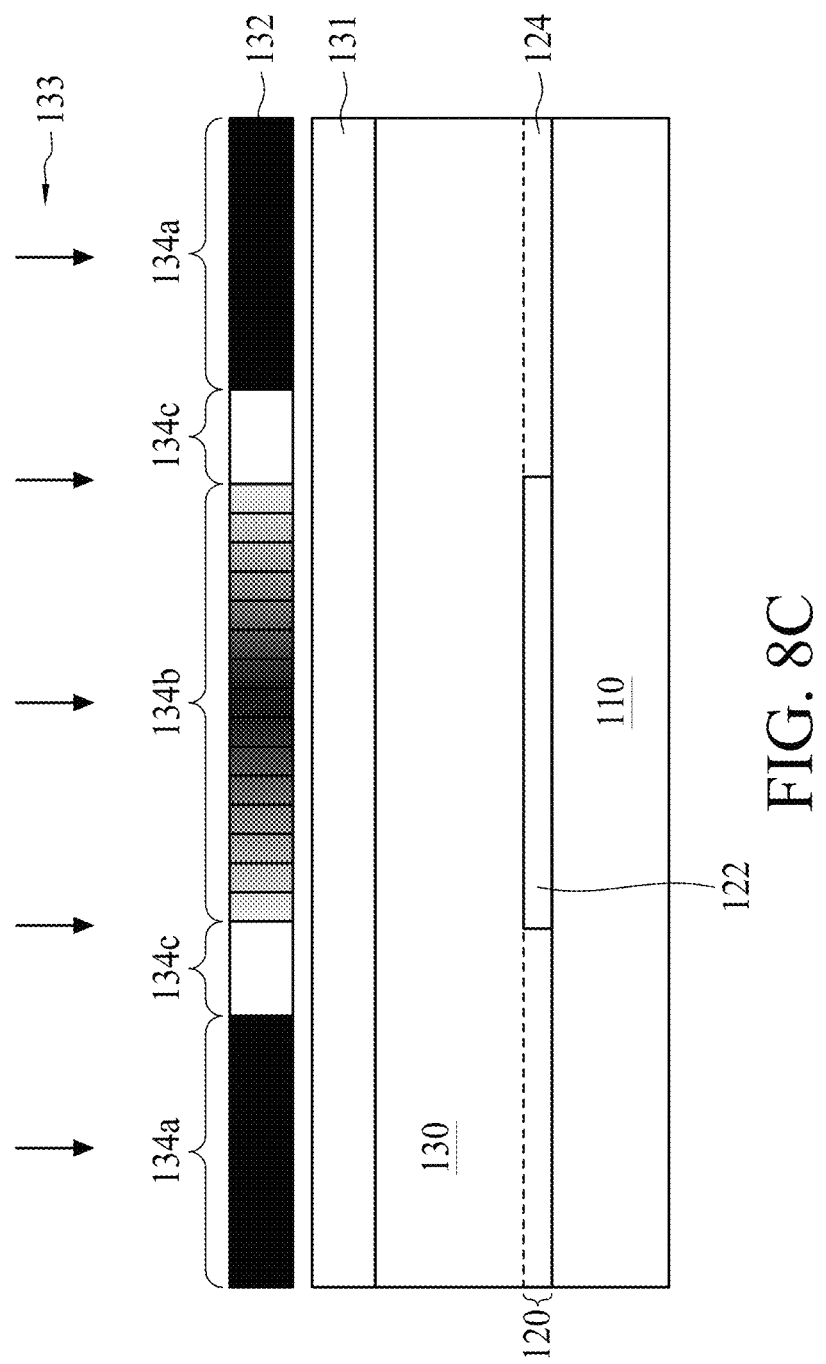

Referring to FIGS. 8C to 8E, in some embodiments, the dielectric structure 130 is patterned to simultaneously form a cavity 150 and a protrusion 160 in the cavity 150 in operation 303.

As shown in FIGS. 8C and 8D, in some embodiments, a grayscale photomask 132 is provided to pattern the dielectric structure 130. In some embodiments, the grayscale photomask 132 includes opaque areas 134*a*, a grayscale area 134*b*, and transparent areas 134*c*. The grayscale photomask 132 and the masking layer 131 are exposed to radiation 133. Thus, 3-dimensional (3D) patterns are formed in the masking layer 131. As shown in FIG. 8D, the patterned masking layer 131 may include first patterns 135*a* including a first thickness that are formed by transmitting the radiation 133 through the opaque areas 134*a*, a second pattern 135*b* including varying second thicknesses that is formed by transmitting the radiation 133 through the grayscale area 134*b*, and openings 135*c* that are formed by transmitting the radiation 133 through the transparent areas 134*c*. In some embodiments, the second thicknesses of the second pattern 135*b* may all be less than the first thickness of the first patterns 135*a*. In some embodiments, the 3D pattern may be transferred from the patterned photoresist to the hard mask layer.

In some embodiments, an etching, operation is performed to transfer the 3D patterns from the patterned masking layer 131 to the dielectric structure 130. Thus, the cavity 150 and the protrusion 160 are simultaneously formed in the dielectric structure 130, as shown in FIG. 8E. In some embodiments, a depth D of the cavity 150 is defined as a distance from an opening of the cavity 150 (or from a top surface of the dielectric structure 130) to a bottom surface of the cavity 150, and a height H of the protrusion 160 is defined as a distance from a top surface of the protrusion 160 to a bottom of the protrusion 160 (or the bottom surface of the cavity 150). As mentioned above, the height H of the protrusion 160 is less than the depth D of the cavity 150. In some embodiments, by providing different grayscale photomasks 132, the protrusion 160 may have different profiles. For example, in a cross-sectional view, the protrusion 160 may form a triangle, a trapezoid, or a rectangle with teeth, according to different pattern designs of the grayscale photomasks 132. Additionally, the grayscale photomask 132 may be used to pattern the dielectric structure 130 to form the protrusion 160 having a plurality of pillars 134 with same heights, as shown in FIG. 5. In such embodiments, the height of each pillar 134 is less than the depth D of the cavity 150, due to the grayscale photomask 132.

Still referring to FIG. 8E, in some embodiments, the cavity 150 overlaps the top conductive layer 122. However, the top conductive layer 122 is separated from the cavity 150 by the dielectric structure 130. The protrusion 160 overlaps the top conductive layer 122, but is separated from the top conductive layer 122 by the dielectric structure 130. Further, the protrusion 160 is separated from sidewalls of the cavity 150. In some embodiments, by having different design for the grayscale photomasks 132, a width of the bottom of the protrusion 160 may be greater than a width of the top conductive layer 122. In some alternative embodiments, the width of the bottom of the protrusion 160 may be less than the width of the top conductive layer 122, as shown in FIG. 8E.

Figure 8F:
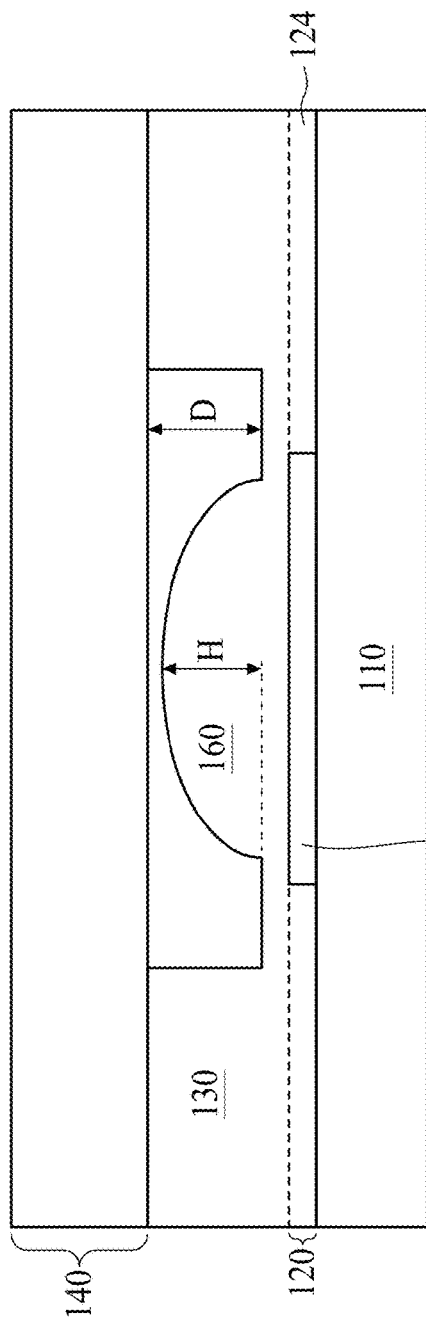

Referring to FIG. 8F, in some embodiments, a MEMS substrate 140 is bonded to the dielectric structure 130 to seal the cavity 150 in operation 304. Because the height H of the protrusion 160 is less than the depth D of the cavity 150, the protrusion 160 is separated from the MEMS substrate 140 when the semiconductor structure is not in operation. As mentioned above, the MEMS substrate 140 may include a semiconductor material. In such embodiments, the MEMS substrate may be doped.

Figure 8G:
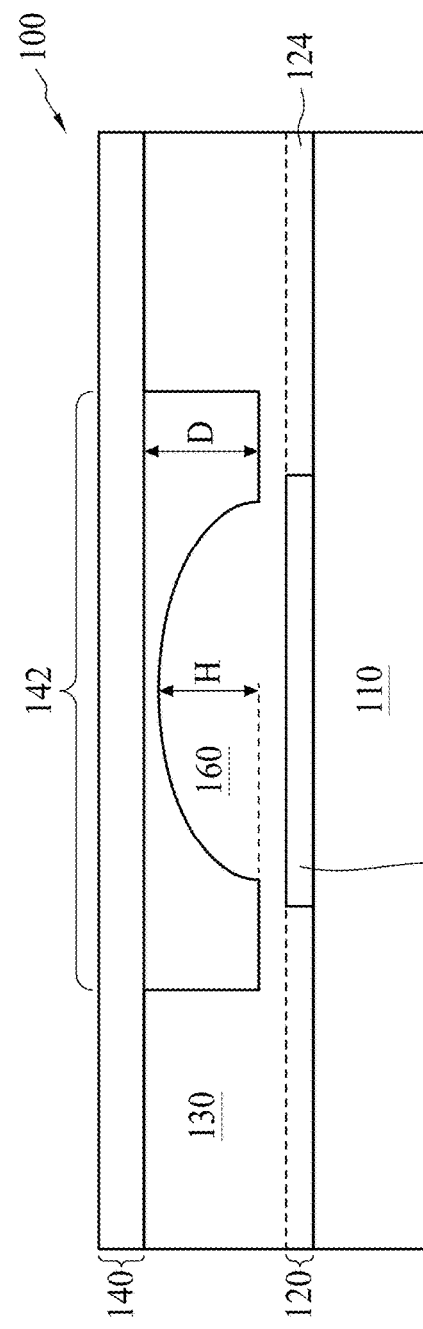

Referring to FIG. 8G, in some embodiments, the MEMS substrate 140 is thinned down. In other words, a thickness of the MEMS substrate 140 is reduced. The MEMS substrate 140 includes a movable membrane 142 over the cavity 150. In some embodiments, the movable membrane 142 may be a doped region of the MEMS substrate 140. In some embodiments, the movable membrane 142 may include a conductive layer disposed along a lower surface or an upper surface of the MEMS substrate 140, though not shown. In some embodiments, the doped region or the conductive layer over the MEMS substrate 140 serves as a top electrode of the CMUT cell. Accordingly, a semiconductor structure 100 serving as a CMUT cell is obtained.

Figure 9:
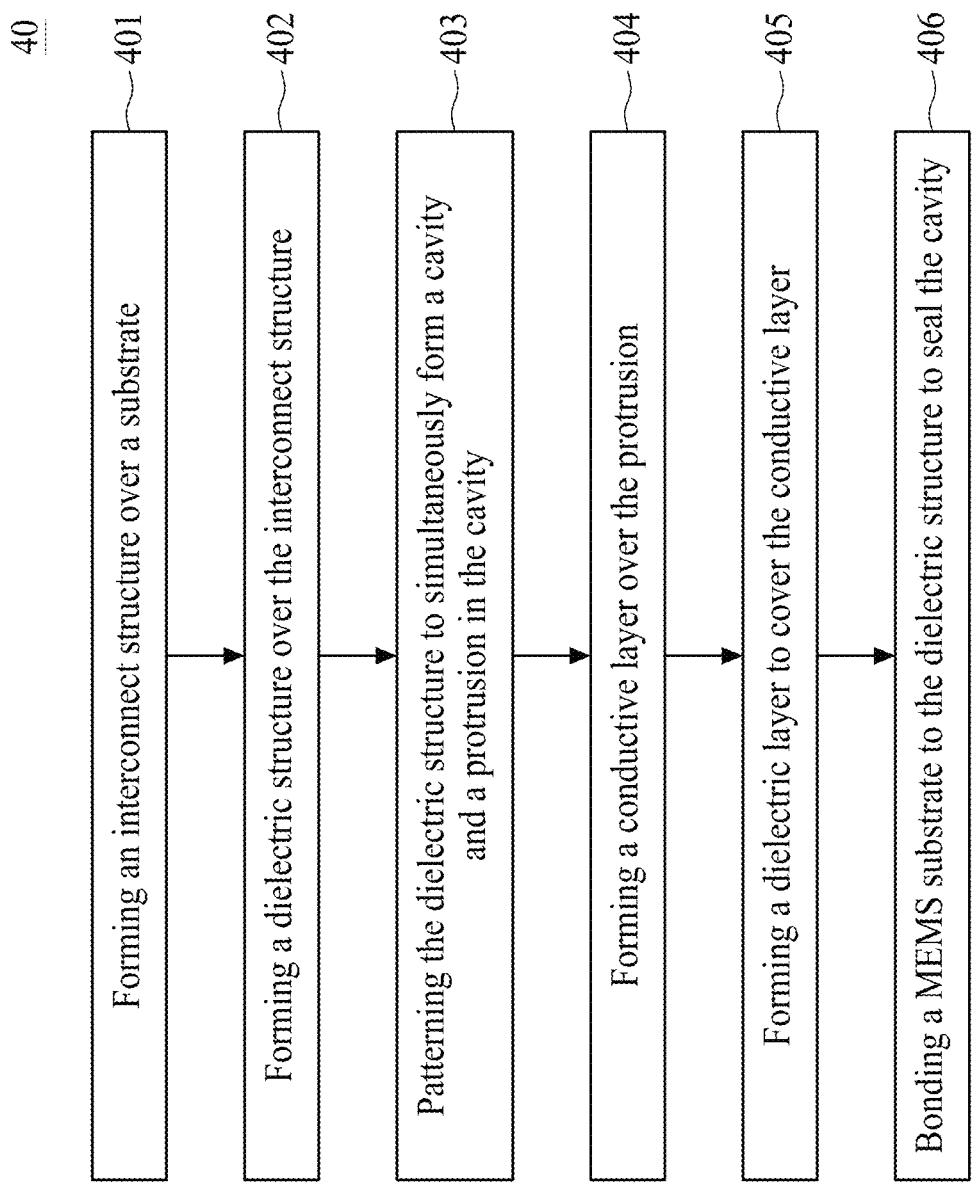
FIG. 9 is a flowchart representing a method for manufacturing a semiconductor structure according to aspects of the present disclosure.

FIG. 9 is a flowchart representing a method for manufacturing a semiconductor structure 40 according to aspects of the present disclosure. The method for terming the semiconductor structure 40 includes a number of operations (401, 402, 403, 404, 405, and 406) and is further described below according to one or more embodiments. It should be noted that the operations of the method 40 may be omitted, rearranged or otherwise modified within the scope of the various aspects. It should further be noted that additional operations may be provided before, during, and after the method 40, and that some other operations may be only briefly described herein. Thus, other implementations are possible within the scope of the various aspects described herein. FIGS. 10A to 10I are schematic drawings illustrating a semiconductor structure at various stages in a method for forming a semiconductor structure according to aspects of one or more embodiments of the present disclosure. It should be noted that same elements in FIGS. 6A and 10A to 10I include same materials; thus, repeated detailed descriptions of such elements are omitted for brevity.

Referring to FIG. 10A, in some embodiments, an interconnect structure 220 is formed over a substrate 210 in operation 401. As mentioned above, the substrate 210 may include a semiconductor substrate with various IC devices disposed in and over the semiconductor substrate. The IC devices may be formed in or over the semiconductor substrate by FEOL processes. The interconnect structure 220 is formed over the substrate 210 by BEOL processes. Further, the interconnect structure 220 may be electrically connected to the IC devices by connecting structures made by MEOL processes. Detailed descriptions of the IC devices, the connecting structures, and the conductive layers, conductive vias and dielectric layers of the interconnect structure 220 are omitted. However, arrangements and connections of such elements may be easily realized because the FEOL processes, the MEOL processes and the BEOL processes may be familiar to those skilled in the art.

Referring to FIG. 10B, in some embodiments, a dielectric structure 230 is formed over the interconnect structure 220 in operation 402. In some embodiments, after the forming of the dielectric structure 230, a masking layer 231 is formed on the dielectric structure 230.

Figure 10C:
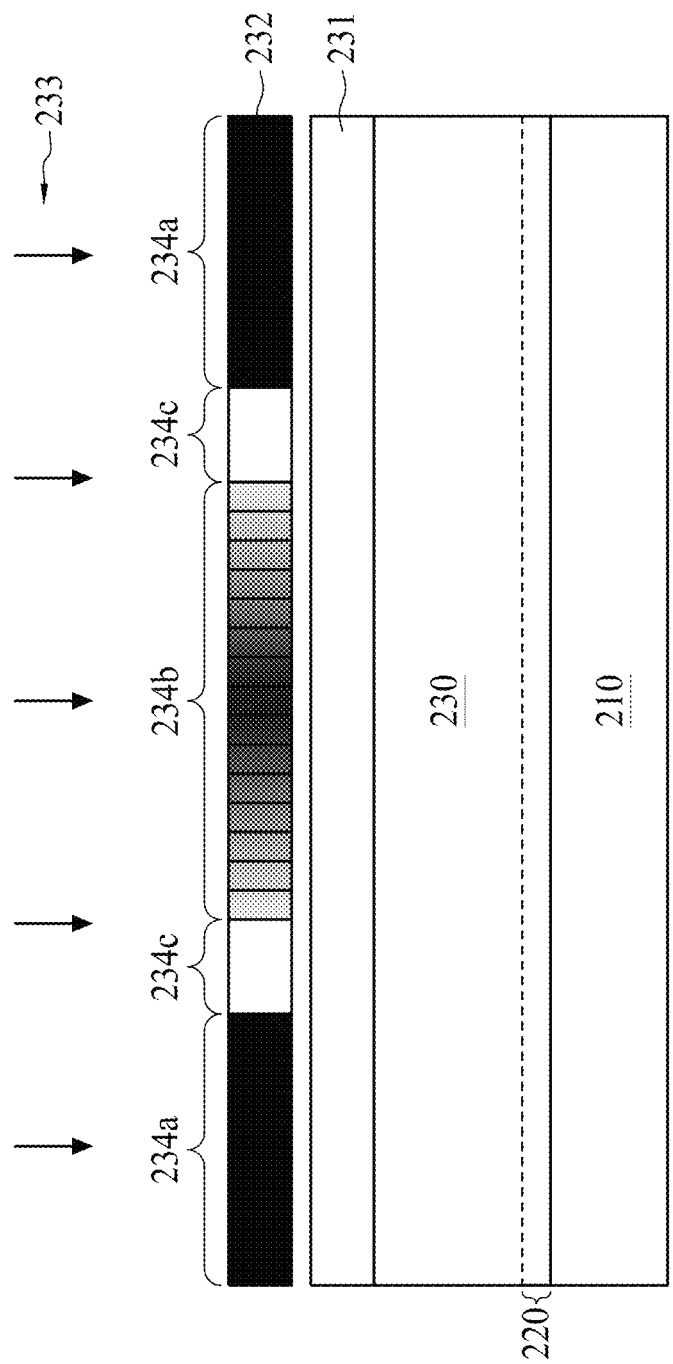
Figure 10D:
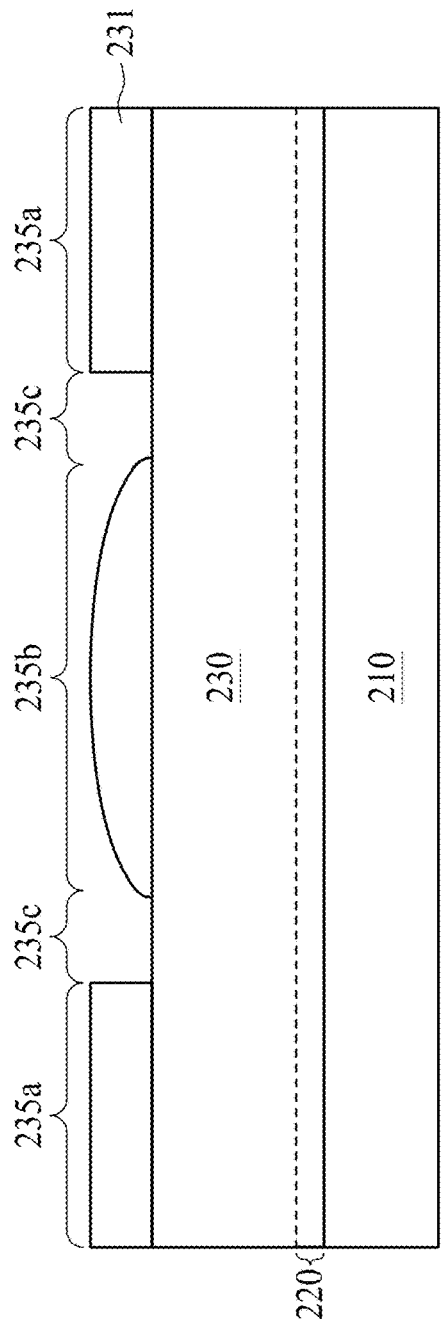
Figure 10E:
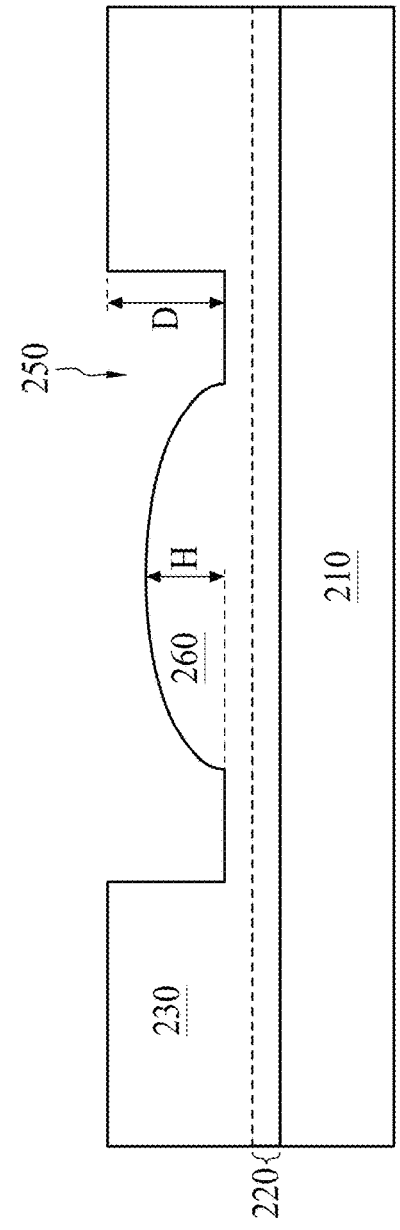

Referring to FIGS. 10C to 10E, in some embodiments, the dielectric structure 230 is patterned to simultaneously form a cavity 250 and a protrusion 260 in the cavity 250 in operation 403. Referring to FIG. 10C, in some embodiments, a grayscale photomask 232 is provided to pattern the dielectric structure 230. In some embodiments, the grayscale photomask 232 includes opaque areas 234a, a grayscale area 234b, and transparent areas 234c. The grayscale photomask 232 and the masking layer 231 are exposed to radiation 233, as shown in FIG. 10C. Thus, 3D patterns are formed in the masking layer 231, as shown in FIG. 10D. The patterned masking layer 231 may include first patterns 235a including a first thickness that are formed by transmitting the radiation 233 through the opaque areas 234a, a second pattern 235b including varying second thicknesses that is formed by transmitting the radiation 233 through the grayscale area 234b, and openings 235c that are formed by transmitting the radiation 233 through the transparent areas 234c. In some embodiments, the second thicknesses of the second pattern 235b may all be less than the first thickness of the first patterns 235a.

Referring to FIG. 10E, in some embodiments, an etching operation is performed to transfer the 3D patterns from the patterned masking layer 231 to the dielectric structure 230. Thus, the cavity 250 and the protrusion 260 are simultaneously formed in the dielectric structure 230. In some embodiments, a depth D of the cavity 250 is defined as a distance from an opening of the cavity 250 (or a top surface of the dielectric structure 230) to a bottom surface of the cavity 250, and a height H of the protrusion 260 is defined as a distance from a top surface of the protrusion 260 to a bottom of the protrusion 260 (or the bottom surface of the cavity 250). As mentioned above, the height H of the protrusion 260 is less than the depth D of the cavity 250. As mentioned above, by providing different grayscale photomasks 232, the protrusion 260 can have different profiles. Further, the protrusion 260 is separated from sidewalls of the cavity 250.

Figure 10F:
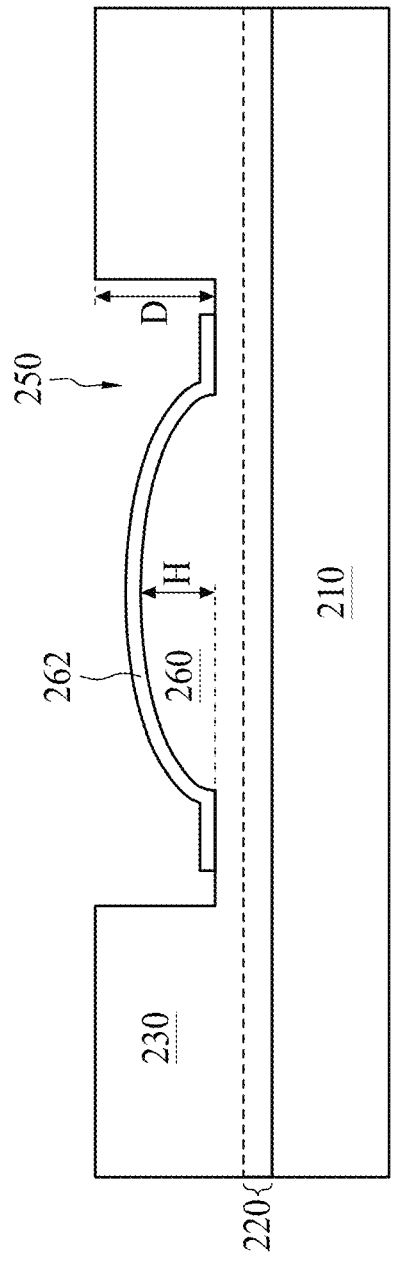

Referring to FIG. 10F, in some embodiments, a conductive layer 262 is formed over the protrusion 260 in operation 404. In some embodiments, a conductive material is conformally formed over the dielectric structure 230, the cavity 250, and the protrusion 260. Subsequently, a patterning operation is performed on the conductive material. Thus, the conductive layer 262 formed over the protrusion 260 is obtained. As shown in FIG. 10F, the conductive layer 262 covers the top surface of the protrusion 260 and portions of the bottom surface of the cavity 250. In addition, the conductive layer 262 is separated from the sidewalls of the cavity 250. In some embodiments, the conductive layer 262 is electrically connected to the IC devices in the substrate 210 through the interconnect structure 220, though not shown. Further, the conductive layer 262 serves as a bottom electrode of a CMUT cell.

Figure 10G:
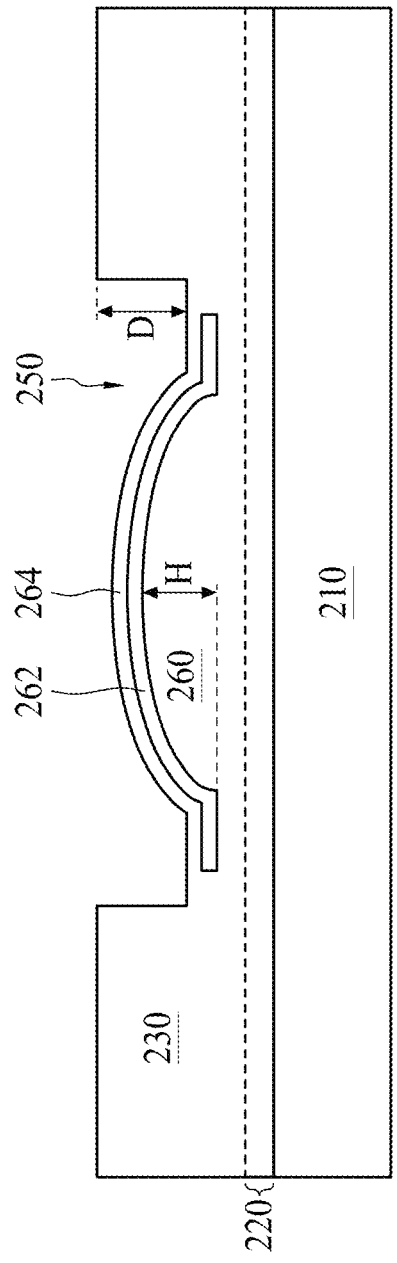

Referring to FIG. 10G, in some embodiments, a dielectric layer 264 is formed to cover the conductive layer 262 in operation 405. In some embodiments, the dielectric layer 264 is conformally formed over the conductive layer 262, the bottom surface of the cavity 250, the sidewalls of the cavity 250, and a top surface of the dielectric structure 230. In some embodiments, a material of the dielectric layer 264 may be similar to that of the dielectric structure 230, but the disclosure is not limited thereto. In some embodiments, the dielectric layer 264 and the dielectric structure 230 may include a same material.

Additionally, the depth D of the cavity 250 may be reduced due to the forming of the dielectric layer 264.

Figure 10H:
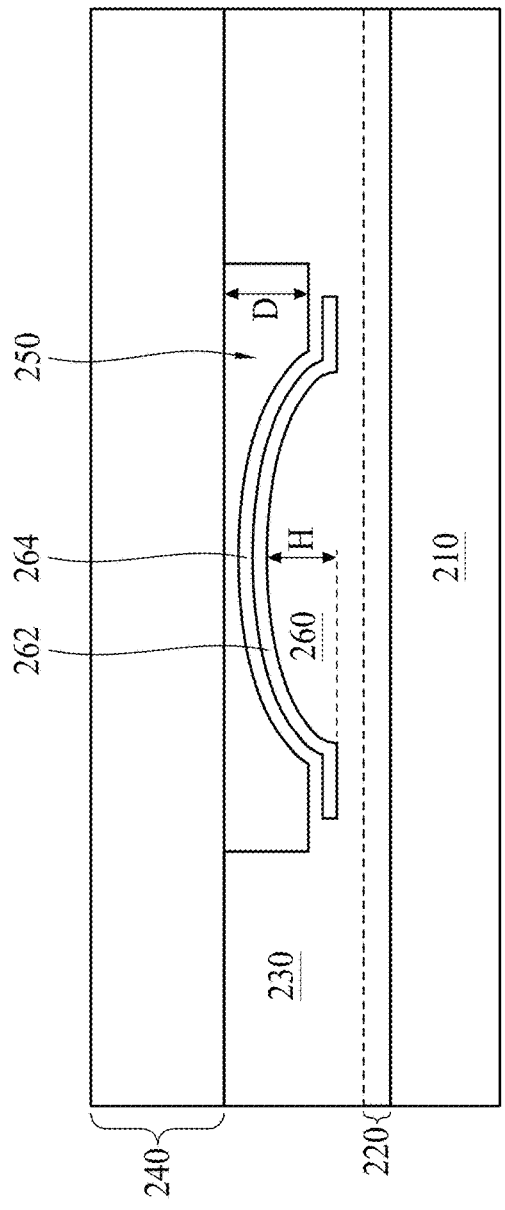

Referring to FIG. 10H, in some embodiments, a MEMS substrate 240 is bonded to the dielectric structure 230 to seal the cavity 250 in operation 406. Further, because the height H of the protrusion 260 is less than the depth D of the cavity 250, the protrusion 260, the conductive layer 262 and the dielectric layer 264 are all separated from the MEMS substrate 240 when the semiconductor structure is not in operation. As mentioned above, the MEMS substrate 240 may include a semiconductor material. In such embodiments, the MEMS substrate may be doped.

Figure 10I:
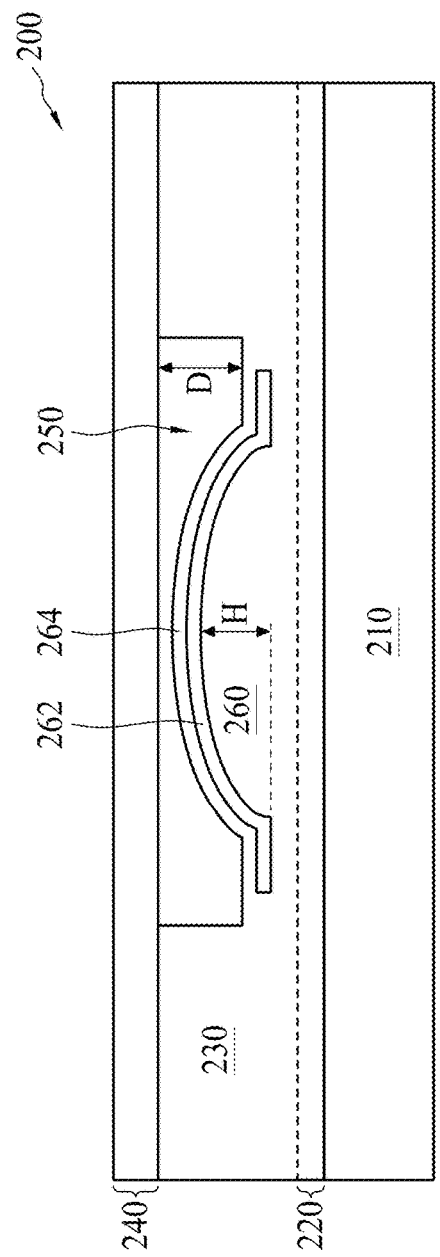

Referring to FIG. 10I, in some embodiments, the MEMS substrate 240 is thinned down. In other words, a thickness of the MEMS substrate 240 is reduced. The MEMS substrate 240 includes a movable membrane 242 over the cavity 250. In some embodiments, the movable membrane 242 may be a doped region of the MEMS substrate 240. In some embodiments, the movable membrane 242 may include a conductive layer disposed along a lower surface or an upper surface of the MEMS substrate 240, though not shown. In some embodiments, the doped region or the conductive layer over the MEMS substrate 240 serves as a top electrode of the CMUT cell. Accordingly, a semiconductor structure 200 serving as a CMUT cell is obtained.

The present disclosure provides a semiconductor structure including a protrusion disposed in a sealed cavity. A moving distance between a movable membrane and the protrusion is less than a distance between the movable membrane and a bottom surface of the sealed cavity. Therefore, a pull-in voltage is reduced, which effectively reduces the charging. In addition, because a width of an upper portion of the protrusion is less than a width of a lower portion of the protrusion, an area of contact between the protrusion and the movable membrane is reduced, and thus accumulation of charges due to friction is further reduced. Consequently, device performance is improved. In some embodiments, by thrilling a bottom electrode over the protrusion, capacitance is increased, and thus device performance of the semiconductor structure is further improved.

In some embodiments, a semiconductor structure is provided. The semiconductor structure includes a substrate, a MEMS substrate, a dielectric structure between the substrate and the MEMS substrate, a cavity in the dielectric structure, an electrode over the substrate and underlying the cavity, and a protrusion disposed in the cavity. The MEMS substrate includes a movable membrane, and the cavity is sealed by the movable membrane. A height of the protrusion is less than a depth of the cavity.

In some embodiments, a method for forming a semiconductor structure is provided. The method includes following operations. An interconnect structure is formed over a substrate. The interconnect structure includes a top conductive layer. A dielectric structure is formed over the interconnect structure. The dielectric structure is patterned to simultaneously form a cavity and a protrusion in the cavity. A MEMS substrate is bonded to the dielectric structure to seal the cavity. The protrusion is separated from the MEMS substrate.

In some embodiments, a method for forming a semiconductor structure is provided. The method includes following operations. An interconnect structure is formed over a substrate. A dielectric structure is formed over the interconnect structure. The dielectric structure is patterned to simultaneously form a cavity and a protrusion in the cavity. A conductive layer is formed over the protrusion. A dielectric layer is formed to cover the conductive layer. A MEMS substrate is bonded to the dielectric structure to seal the cavity. The protrusion, the conductive layer and the dielectric layer are separated from the MEMS substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a microelectromechanical system (MEMS) substrate over a surface of the substrate, wherein the MEMS substrate comprises a movable membrane;
   a dielectric structure between the substrate and the MEMS substrate;
   a cavity in the dielectric structure, wherein the cavity is sealed by the movable membrane;
   an electrode over the substrate; and
   a dielectric protrusion disposed in the cavity;
   wherein a height of the dielectric protrusion is less than a depth of the cavity, and the dielectric protrusion overlaps the electrode.

2. The semiconductor structure of claim 1, wherein the dielectric protrusion overlaps the electrode in a direction perpendicular to the surface of the substrate.

3. The semiconductor structure of claim 1, further comprising a plurality of dielectric teeth over a top surface of the dielectric protrusion.

4. The semiconductor structure of claim 1, wherein the dielectric protrusion comprises a plurality of pillars.

5. The semiconductor structure of claim 1, the dielectric protrusion is separated from sidewalls of the cavity.

6. The semiconductor structure of claim 1, further comprising an interconnect structure between the dielectric structure and the substrate, wherein the electrode is a top conductive layer of the interconnect structure.

7. The semiconductor structure of claim 1, wherein a distance between the electrode and a top surface of the dielectric protrusion is greater than the height of the dielectric protrusion.

8. The semiconductor structure of claim 1, further comprising a dielectric layer disposed over the dielectric protrusion, wherein the electrode is disposed between the dielectric protrusion and the dielectric layer.

9. The semiconductor structure of claim 8, wherein the electrode and the dielectric layer are separated from the movable membrane.

10. A semiconductor structure, comprising:
    a substrate;
    a microelectromechanical system (MEMS) substrate over a surface of the substrate;
    a dielectric structure between the substrate and the MEMS substrate;
    a cavity in the dielectric structure;
    an electrode over the substrate; and
    a plurality of dielectric pillars in the cavity;
    wherein a height of each dielectric pillar is less than a depth of the cavity, and each dielectric pillar overlaps the electrode.

11. The semiconductor structure of claim 10, wherein each dielectric pillar overlaps the electrode in a direction perpendicular to the surface of the substrate.

12. The semiconductor structure of claim 10, further comprising an interconnect structure between the dielectric structure and the substrate, wherein the electrode is a top conductive layer of the interconnect structure.

13. The semiconductor structure of claim 10, wherein a distance between the electrode and top surfaces of the plurality of dielectric pillars is greater than the height of the plurality of dielectric pillars.

14. The semiconductor structure of claim 10, wherein the MEMS substrate comprises a movable membrane, and the cavity is sealed by the movable membrane of the MEMS substrate.

15. A semiconductor structure, comprising:
    a substrate;
    a microelectromechanical system (MEMS) substrate over a surface of the substrate;
    a dielectric structure between the substrate and the MEMS substrate;
    a cavity in the dielectric structure;
    an electrode over the substrate;
    a protrusion disposed in the cavity; and
    a dielectric layer disposed over the protrusion,
    wherein the electrode and the dielectric layer are conformal to a configuration of the protrusion,
    wherein the electrode is disposed between the protrusion and the dielectric layer, and the electrode and the dielectric layer overlap the protrusion.

16. The semiconductor structure of claim 15, wherein a height of the protrusion is less than a depth of the cavity.

17. The semiconductor structure of claim 15, wherein the electrode and the dielectric layer overlap the protrusion in a direction perpendicular to the surface of the substrate.

18. The semiconductor structure of claim 15, the protrusion is separated from sidewalls of the cavity.

19. The semiconductor structure of claim 15, further comprising an interconnect structure between the dielectric structure and the substrate.

20. The semiconductor structure of claim 15, wherein the MEMS substrate comprises a movable membrane, and the cavity is sealed by the movable membrane of the MEMS substrate.

* * * * *